United States Patent [19]

Sun et al.

[11] Patent Number: 5,664,066
[45] Date of Patent: Sep. 2, 1997

[54] INTELLIGENT SYSTEM FOR AUTOMATIC FEATURE DETECTION AND SELECTION OR IDENTIFICATION

[75] Inventors: Chuen-Tsai Sun, Pao-Shan Shiang, Taiwan; Jyh-Shing Jang, Framingham, Mass.; Chi-Yung Fu, San Francisco, Calif.

[73] Assignee: The United States of America as represented by the United States Department of Energy, Washington, D.C.

[21] Appl. No.: 304,660

[22] Filed: Sep. 9, 1994

Related U.S. Application Data

[63] Continuation-in-part of Ser. No. 973,865, Nov. 9, 1992.
[51] Int. Cl.$^6$ .................................................. G06F 15/18
[52] U.S. Cl. .................................................. 395/23
[58] Field of Search ........................ 395/23, 22, 11, 395/900

[56] References Cited

U.S. PATENT DOCUMENTS

| | | | |
|---|---|---|---|
| 5,416,888 | 5/1995 | Shimokawa | 395/22 |
| 5,448,681 | 9/1995 | Khan | 395/11 |
| 5,465,320 | 11/1995 | Enbutsu et al. | 395/22 |

OTHER PUBLICATIONS

Lin et al., Neural–Network–based fuzzy logic control and decision system, IEEE Transactions on computers, vol. 40., pp. 1320–1336. Dec. 1991.

Kawamura et al., A prototype of neuro–fuzzy cooperation system, IEEE International conference on fuzzy systems, pp. 1275–1282. Mar. 12, 1992.

Okada et al., Initializing multilayer neural networks with fuzzy logic, IJCNN International Joint Conference on Neural Networks, pp. 239–244. Jun. 11, 1992.

(List continued on next page.)

*Primary Examiner*—Robert W. Downs
*Assistant Examiner*—Sanjiu Shah
*Attorney, Agent, or Firm*—Henry P. Sartorio; William C. Daubenspeck; William R. Moser

[57] ABSTRACT

A neural network uses a fuzzy membership function, the parameters of which are adaptive during the training process, to parameterize the interconnection weights between an (n-1)'th layer and an n'th layer of the network. Each j'th node in each k'th layer of the network except the input layer produces its output value $y_{k,j}$ according to the function $$y_{k,j} = f_k\left( \sum_{i=1}^{N_{k-1}} w_{k,i,j} y_{k-1,i} \right),$$

where $N_{k-1}$ is the number of nodes in layer k-1, i indexes the nodes of layer k-1 and all the $w_{k,i,j}$ are interconnection weights. The interconnection weights to all nodes j in the n'th layer are given by $w_{n,i,j} = w_{n,j}(i, p_{n,j,1}, \ldots, p_{n,j,P_n})$.

The apparatus is trained by setting values for at least one of the parameters $p_{n,j,1}, \ldots, p_{n,j,P_n}$. Preferably the number of parameters $P_n$ is less than the number of nodes $N_{n-1}$ in layer n-1. $w_{n,j}(i, p_{n,j,1}, \ldots, p_{n,j,P_n})$ can be convex in i, and it can be bell-shaped. Sample functions for $w_{n,j}(i, p_{n,j,1}, \ldots, p_{n,j,P_n})$ include $$w_{n,j}(i, p_{n,j,1}, p_{n,j,2}, p_{n,j,3}) = \frac{\mu_{n,j}(i)}{U_{n,j}}, \text{ where}$$

$$U_{n,j} = \sum_{i=1}^{N_{n-1}} \mu_{n,j}(i) \text{ and}$$

either $\mu_{n,j}(i) = \dfrac{1}{1 + \left[ \left( \dfrac{i - p_{n,j,3}}{p_{n,j,1}} \right)^2 \right]^{p_{n,j,2}}}$ or $\mu_{n,j}(i) = e^{-\left|\frac{i - p_{n,j,1}}{p_{n,j,2}}\right|^{p_{n,j,3}}}$.

44 Claims, 7 Drawing Sheets

OTHER PUBLICATIONS

Enbutsu et al., Fuzzy rule extraction from a multilayered neural network, IJCNN-91, pp. 461-465, Jul. 14, 1991.

Compton & Landon, "Parallel Detection Systems Offer Advantages Beyond the Obvious", Applications Review, published by Tracor Northern (1985). Copy not submitted because it was submitted in prior application SN 07/973,865, filed Nov. 9, 1992.

Hirose, et al., "Back-Propagation Algorithm Which Varies the Number of Hidden Units", Neural Networks (1991), vol. 4, pp. 61-69. Copy not submitted because it was submitted in prior application SN 07/973,865, filed Nov. 9, 1992.

Jang, Jyh-Shing R., "ANFIS: Adaptive-Network-Based Fuzzy Inference System", IEEE Transactions on Systems, Man and Cybernetics (May/Jun. 1993), vol. 23, No. 3, pp. 665-685.

Jang, Jyh-Shing R., "Fuzzy Modeling Using Generalized Neural Networks and Kalman Filter Algorithm", Proceedings of the 9th National Conference on Artificial Intelligence (Jul. 1991), pp. 762-767.

Jenkins, et al., "The Modeling of Plasma Etching Processes Using Response Surface Methodology", Solid State Technology Journal (1986), vol. 29, No. 4, pp. 175-182. Copy not submitted because it was submitted in prior application SN 07/973,865, filed Nov. 9, 1992.

Kaufmann, et al., "Introduction to Fuzzy Arithmetic", Van Nostrand Reinhold Company (1985), pp. 8-15. Copy not submitted because it was submitted in prior application SN 07/973,865, filed Nov. 9, 1992.

Lawrence, J., "Data Preparation for a Neural Network", AI Expert, Nov. 1991, pp. 34-41. Copy not submitted because it was submitted in prior application SN 07/973,865, filed Nov. 9, 1992.

Lee, C.C., "Fuzzy Logic in Control Systems: Fuzzy Logic Controller—Parts I and II", IEEE Transactions on Systems, Man, and Cybernetics, Mar./Apr. 1990, vol 20. No. 2, pp. 404-435. Copy not submitted because it was submitted in prior application SN 07/973,865, filed Nov. 9, 1992.

Lippmann, R.P., "An Introduction to Computing with Neural Nets", IEEE ASSP Magazine, Apr. 1987, pp. 4-22. Copy not submitted because it was submitted in prior application SN 07/973,865, filed Nov. 9, 1992.

Malchov, D.S., "Characterization of Plasma Processes with Optical Emission Spectroscopy", SPIE, Advanced Techniques for Integrated Circuit Processing (Oct. 4, 1990), vol. 1392, pp. 498-505. Copy not submitted because it was submitted in prior application SN 07/973,865, filed Nov. 9, 1992.

Rigler, et al., "Rescaling of Variables in Back Propagation Learning", Neural Networks (1991), vol. 4. pp. 225-229. Copy not submitted because it was submitted in prior application SN 07/973,865, filed Nov. 9, 1992.

Singer, P.H., "Diagnosing Plasmas and Detecting Endpoints", Semiconductor International (Aug. 1988), pp. 66-70. Copy not submitted because it was submitted in prior application SN 07/973,865, filed Nov. 9, 1992.

Sun, et al., "Fuzzy Modeling Based on Generalized Neural Networks and Fuzzy Clustering Objective Functions", Proceedings of the 30th IEEE Conference on Decision and Control (1991). Copy not submitted because it was submitted in prior application SN 07/973,865, filed Nov. 9, 1992.

Sze, S.M., "VLSI Technology", 2d. Ed. (1988), pp. 184-326, 386-400. Copy not submitted because it was submitted in prior application SN 07/973,865, filed Nov. 9, 1992.

Tracor Northern, "The Role of Photodiode Array Detectors in 'Snap-Shot' Spectroscopy" (1985). Copy not submitted because it was submitted in prior application SN 07/973,865, filed Nov. 9, 1992.

Weir, M.K., "A Method for Self-Determination of Adaptive Learning Rates in Back Propagation", Neural Networks (1991), vol. 4, pp. 371-379. Copy not submitted because it was submitted in prior application SN 07/973,865, filed Nov. 9, 1992.

Zadeh, L.A., "Fuzzy Logic", IEEE Computer (1988), pp. 83-93. Copy not submitted because it was submitted in prior application SN 07/973,865, filed Nov. 9, 1992.

Zadeh, L.A., "Fuzzy Sets", Information and Control (1965), vol. 8, pp. 338-353. Copy not submitted because it was submitted in prior application SN 07/973,865, filed Nov. 9, 1992.

INTELLIGENT SYSTEM FOR AUTOMATIC FEATURE DETECTION AND SELECTION OR IDENTIFICATION

CROSS-REFERENCE TO RELATED APPLICATION

This is a continuation-in-part of U.S. patent application SC/Ser. No. 07/973,865, filed Nov. 9, 1992, entitled CLOSED LOOP ADAPTIVE PROCESS CONTROL USING NEURAL NETWORKS (Attorney docket No. IL-8705), by inventor Chi-Yung Fu, assigned to the assignee of the present invention and incorporated herein by reference.

The United States Government has rights in this invention pursuant to Contract No. W-7405-ENG-48 between the U.S. Department of Energy and the University of California, for the operation of Lawrence Livermore National Laboratories.

BACKGROUND OF THE INVENTION

1. Field of the Invention

The invention relates to techniques for incorporating high-order or abstract human knowledge into adaptive learning apparatus, to improve system learning efficiency and accuracy and improve the system's ability to generalize. More particularly, the invention involves adaptive fuzzy membership filters and neural networks using the same. An embodiment is described for the control of processes whose spectra reveal process input parameters.

2. Description of Related Art

A neural network typically comprises a plurality of input neurons, which may simply be isolation buffers and which are sometimes referred to as "first level neurons", to receive input excitation signals. The outputs of the input neurons are coupled to selected ones of the inputs of a plurality of second level neurons via synaptic interconnection circuits or synapses. Different ones of the input signals combine with different weights at the inputs of the second level neurons, and the particular weight to be accorded each signal is governed by a setting in the synaptic interconnection circuit which couples that signal to that neuron. The weighted combination of signals is typically a weighted sum of such signals, and may further be transformed by a transfer function which is typically (but not necessarily) nonlinear. A common nonlinear transformation for this purpose is the sigmoid function. The outputs of the second level neurons may themselves further be coupled through another set of synaptic interconnection circuits, with respective weights, to inputs of respective ones of a plurality of third level neurons. In this case the second level neurons are often referred to as "hidden" neurons. The outputs of the third level neurons may be provided as the outputs of the overall network, in which case these neurons may be referred to as "output neurons", or they may be coupled to yet additional layers of neurons by additional selectively weighted synaptic interconnection circuits. In addition, in some neural network architectures, outputs of some of the neurons are fed back to the inputs of a prior level.

Neural networks may have a fixed interconnection pattern and fixed synaptic weights, or the synaptic weights may be made variable. If the synaptic weights are made variable, then the network may be given the capacity to "learn". Alternatively, the learning process may be simulated off-line, and once the synaptic interconnection weights are determined, they can be transferred into a hardware chip, for example by laser direct write.

Background information on neural networks, including a survey of various architectures for neural networks may be found in "DARPA Neural Network Study", Armed Forces Communications and Electronics Association International Press, November 1988, and in R. P. Lippmann, "An Introduction to Computing with Neural Nets," IEEE ASSP Magazine, April 1987, both incorporated herein by reference. A neural network may be constructed in any known manner, but the techniques described in U.S. patent application Ser. No. 07/894,391, filed Jun. 5, 1992, entitled "Process for Forming Synapses in Neural Networks and Resistor Therefor", by inventor Chi Yung Fu, incorporated herein by reference, are preferred. Alternatively, a neural network can be implemented in software on a computer.

A problem arises when it is desired to use a neural network to analyze a large number of input channels. A large number of input channels implies a very large number of parameters (interconnection weights in a conventional neural network) which need to be adjusted during the learning process. The number of parameters is usually on the order of $(N1+1)*N2+(N2+1)*N3$, where N1, N2 and N3 are the number of neurons in levels 1, 2 and 3, respectively. This results in a lengthy training period. Also, while neural networks can learn, in many situations the learning process could be greatly simplified and the result would be in a more general form, if human or abstract knowledge could be incorporated into the system before the system begins to learn. The higher the form of human or abstract knowledge, the more capable would the system then become. For example, if knowledge of symmetry can be incorporated, then the analysis of the system would be greatly simplified. The question is then how to incorporate such abstract knowledge into a learning system.

The above problems become very apparent where the neural network is used to analyze a spectrum produced by, for example, a plasma in plasma-based manufacturing equipment (although they are by no means limited to this situation). Such equipment is used, for example, the formation or etching of layers in a semiconductor manufacturing process. It is also used in the deposition of thin films used, for example, in superconducting circuits. It is also used in the production of active matrix liquid crystal displays, and in the thin films required for magnetic and optical storage media.

A plasma is a collection of electrons, radicals, positive and negative ions, neutral atoms, molecules and molecular fragments. The plasma excitation can be caused by RF or microwave frequency power applied, or by other methods as well. The plasma can also be enhanced, by coupling with a magnetic field.

Plasmas are used in semiconductor and thin film manufacturing, primarily in several types of process steps. In plasma-enhanced chemical vapor deposition (PECVD), input gases are reacted in a glow discharge to form a plasma, which reacts chemically at a subject surface (e.g., a wafer) to deposit a desired material thereon. Plasma enhanced (assisted) depositions are described in Sze, "VLSI Technology", 2d. Ed. (1988), primarily at pp. 262-266. The entire Sze reference is incorporated by reference herein. In a "sputtering" technique, a plasma is formed in a manner similar to that in PECVD, but the plasma is attracted to a target. The plasma bombards the target with high enough energy to loosen particles of the target material, such as aluminum, which then deposit on the subject surface. Sputtering deposition is described primarily at p. 387 of Sze.

In a plasma etching technique, the plasma generates highly reactive fragments and radicals which react with the surface material to form volatile products. These volatile products leave the surface, resulting in etching. In reactive ion etching (RIE), in addition to the chemical reactions, ions are accelerated toward the surface material and either react directly with the material or assist in the reaction by a radical, thus enhancing the etching process. Reactive plasma etching is described primarily at pp. 184–232 of Sze, and RIE is described in Sze, primarily at pp. 213–215 and 396–398. In all of these techniques, it is important that the flow rate of the gases provided to form the plasma, the plasma power applied to form the plasma, the biasing of the subject surface, the temperature of the subject surface, and the pressure inside the chamber containing the plasma and the subject surface, be carefully controlled so that a plasma having exactly the desired characteristics is formed.

In the past, plasma-based processing equipment has used individual closed-loop control of the input parameters such as pressure, power and gas flow, to try to maintain them each at a value known to produce a desired plasma. This type of control is indirect since it is not the measured parameters that individually control the outcome of the process, but the combined effect of all the parameters. Such control systems also fail to take into account calibration errors in the controls, as well as other, uncontrolled, sources of gas which may affect the plasma. For example, in oxygen-reactive sputtered deposition, useful for example to deposit $Al_2O_3$, the oxygen flowing through the mass flow controller into the chamber may not be the only source of oxygen. Oxygen may also be out-gassing from the interior walls of the chamber. Extra sources of gas such as out-gassing are not accounted for in the case of conventional process control. Thus, although each input parameter to the plasma-based process step is under closed-loop control, the overall process step may not be entirely closed-loop. Yields may thereby be reduced, and manufacturing costs increased.

The conventional technique is also very difficult to model for process optimization. For a conventional plasma processing step, fundamental process modeling requires a detailed understanding and application of plasma physics which, though making substantial progress, is not yet readily available in a manufacturing environment. Thus, process optimization requires extensive experimentation on actual equipment and is typically statistically base. In addition, moving a process to new or different equipment requires parameter adjustments and substantial downtime, thereby discouraging equipment upgrades and complicating the replacement of worn equipment.

The inadequacies of the conventional technique for controlling input parameters sometimes result in bad runs which process engineers must try to rescue. At present, if a process deviates from specification during processing, the resulting processing errors are corrected either by rework, in which the process is stopped and the erroneous step is redone, or by "feed forward", in which the process continues and adjustments are made in subsequent process steps to compensate for the error. Both options cause logistical and scheduling problems in the operation of the fabrication line. Additionally, merely because the conventional technique accepts errors rather than preventing them, they render reliability of the product uncertain.

Because the conventional technique is not entirely closed-loop, a metrology step is often included after a plasma processing step to measure such results as the thickness of deposited material, resistivity, etc. In the evolving cluster tool concept, equipment is grouped under a vacuum and wafers are transferred between processing systems by robotic arms. Cluster tools typically have a limited number of ports for processing stations. The need to include metrology steps, therefore restricts the number of pieces of processing equipment which may be placed in a cluster.

Apart from the actual wafer processing problems caused by conventional process control equipment, maintenance and repair of the equipment is another major manufacturing issue. Overmaintenance is costly since it unnecessarily increases equipment downtime, but undermaintenance risks faulty products or low yield. At present, repair of processing equipment is typically performed after the equipment fails, which is undesirable because downtime for unscheduled repair can cause significant logistical and schedule problems.

Further, the conventional plasma-based processing technique cannot be used to deposit certain materials or materials with certain properties since the processing for such materials is difficult to control.

The related application mentions that when particles in a plasma relax to a less excited state, they emit energy in a portion of the electromagnetic spectrum which ranges mostly in the extended optic frequency range (including far IR and deep UV). There is a one-to-one correspondence between a given plasma and the input conditions (e.g., gas flow, pressure, plasma excitation frequency and power) for a particular system configuration under which it was produced, but the particular correspondence is in most cases not known and varies from one piece of equipment to another. As discussed in Sze, plasma spectra have been used in the past to determine the presence or absence of particular neutral and ionic species by correlating an experimental spectral series with a previously determined spectral series. Relative concentrations of species were obtainable in this manner, although minor variations were typically too subtle for a process engineer or even a plasma specialist to detect. Plasma spectra have also been used for "endpoint detection", i.e., determining when a plasma processing step is complete. This is possible in an etching step, for example, when the complete removal of an etched layer eliminates the contribution which the etched layer provided to the composition of the plasma. See also Malchov, "Characterization of Plasma Processes with Optical Emission Spectroscopy", SPIE Vol. 1392, Advanced Techniques for Integrated Circuit Processing (Oct. 4, 1990), pp. 498–505, incorporated by reference herein.

According to the related application, roughly described, the characteristics of the plasma in a plasma-based manufacturing process step are monitored directly and in real time by observing the spectrum which it produces. One or more of the process input parameters are controlled or adjusted in response to any deviation of the spectrum beyond a narrow range. This approach is advantageous because the success of the processing step depends on the characteristics of the ultimate plasma, rather than on the separately controlled input conditions in response to which the plasma is formed. If, for example, one of the flow controllers in a conventional system is out of calibration, then it may be maintaining an incorrect flow condition while reporting back that its flow is at the target value. The plasma spectrum will be slightly different, however, and a system which monitors the plasma directly rather than merely an input parameter will be able to compensate for such miscalibration.

As mentioned, the differences between the spectra produced by plasmas are extremely subtle, usually too subtle to be detected by a process engineer or plasma specialist. Additionally, the actual correspondence between the spectrum produced by a plasma and its input parameters are generally not presently known. According to another aspect of the invention, an artificial neural network is used to analyze the plasma spectrum and generate the control signals necessary to adjust one or more of the input parameters as necessary. Neural networks are very effective in identifying small signal changes in a very noisy environment, and can learn the relationships between input parameters and plasma spectra without any requirement that they be derived in advance.

The monitoring of plasma spectra is an advantageous way of controlling the process step since highly reliable optical sensing techniques (e.g., optical spectrometers) are available and are routinely used in semiconductor processing (e.g., to determine when to end a process step). Further, such sensors can be external to the processing chamber and thus avoid perturbing the process step. Optical sensing is also extremely fast, thus allowing real-time monitoring and control of single-wafer processing.

By monitoring the plasma itself at the reaction site, closed-loop control is provided which automatically compensates for otherwise uncontrolled sources of gases, miscalibrations of input parameter controls, and other sources of error not adequately addressed in conventional systems. Thus processing mistakes are prevented by correcting the input parameters in real-time so that the results satisfy the target criteria. Thus the amount of rework and feed forward to correct a processing error is minimized. Additionally, since the process is controlled to satisfy the target criteria of the plasma itself, most metrology equipment may be unnecessary.

Direct monitoring of plasma characteristics also permits a trend analysis of the adjustment signals provided to the input parameter controls. Such trends can predict which components actually require servicing. Thus, servicing and equipment downtime can be scheduled just in time, and, in conjunction with the scheduling of maintenance on other equipment in a fabrication line, can avoid both undermaintenance and overmaintenance.

Further, intelligent adaptive control can be used to deposit materials that were previously not achievable in a plasma-based processing step because the processing for such materials is difficult.

Though not exclusively, intelligent adaptive control may be applied most advantageously in back-end plasma processing since back-end interconnects strongly influence chip yield, performance and reliability. Applying the technique to back-end inter-chip-level interconnects can also impact packaging technology. The technique can be applied in III-V or II-VI processing as well as in silicon-based processing.

Thus the analysis of a plasma spectrum during a manufacturing process step is a desirable application for a neural network. But the application is not limited to plasma spectra—it is also desirable to use a neural network to analyze other types of optical and non-optical spectra as well, such as a mass spectrum produced by a residue gas analyzer (RGA), an emission spectrum such as that produced by laser-induced fluorescence, spectra produced by colorimeters, photometers, spectrophotometers, atomic absorption spectrometers and by other techniques of absorption spectroscopy. There are, of course, many non-spectrum-based applications for neural networks as well.

However, adequate spectral analysis often requires observation of a range of wavelengths divided into a large number of signal channels. If all such signal channels are provided as inputs to a conventional neural network, then the problems mentioned above of large numbers interconnection weights arise.

Accordingly, it is an object of the invention to provide techniques to manage a large number of inputs to a neural network by using abstract human knowledge as a constraint. The techniques provided herein can significantly reduce the number of parameters for training, as well as take advantage of abstract knowledge already known about the system being analyzed. As will be seen, the techniques can be used also without a large number of inputs and, indeed, even without a neural network.

SUMMARY OF THE INVENTION

According to the invention, roughly described, adaptive learning apparatus has a plurality of nodes grouped into levels. As in a conventional neural network, each j'th node in each k'th level except the input level produces an output value according to the function $$y_{k,j} = f_k\left(\sum_{i=1}^{N_{k-1}} w_{k,i,j} y_{k-1,i}\right),$$

where i indexes the nodes of level k-1 and all the w's are connection weights. In a convention neural network, all of the connection weights are adjustable and need to be trained. For example, if the first level of the network (the input level) has 700 nodes and the second level has 8 nodes, then more than 5,000 connection weights need to be trained, and this accounts only for the weights which exist between the first and second levels (also called layers) of the system.

To reduce the number of parameters that need to be adjusted, a fuzzy membership function is used to define the interconnection weights between two of these layers. Fuzzy logic is described in Zadeh, "Fuzzy Logic", IEEE Computer, pp. 83–93 (1988), incorporated herein by reference, and in Jang, "ANFIS: Adaptive-Network-Based Fuzzy Inference System", IEEE Transactions on Systems, Man, and Cybernetics, Vol. 23, No. 3 (May/June 1993), pp. 665–685, also incorporated herein by reference.

Using this concept, all of the interconnection weights from the input layer to the second layer of nodes are defined by a function $$w_j(i) = \frac{\mu_j(i)}{U_j},$$

where j is the node number in the second layer of nodes, and i is the node number in the first layer of nodes, and $$U_j = \sum_{i=1}^{N} \mu_j(i).$$

$\mu_j(i)$ is a fuzzy membership function defined by a number of parameters which is preferably small, and which can differ among the second-level nodes j. In one embodiment, for example, $$\mu_j(i) = \frac{1}{1 + \left[\left(\frac{i - c_j}{a_j}\right)^2\right]^{b_j}}.$$

In another embodiment, $$\mu_j(i) = e^{-\left|\frac{i - c_j}{b_j}\right|^{r_j}}.$$

In both examples, only three parameters $a_j$, $b_j$ and $c_j$ are trained for each j'th one of the second-level nodes. This is to be contrasted with N connection weights which need to be trained in the conventional arrangement for each j'th one of the second-level nodes, where N is the number of nodes in the first level of the network.

The tremendous reduction in the number of parameters for training is achieved because the field of connection weights being input to the j'th second-level node has been parameterized. Abstract knowledge has been used to choose the parameterized function. Both of the sample fuzzy membership functions $\mu_j(i)$ mentioned above are bell-shaped in i, thereby incorporating knowledge that in the particular system being analyzed, only the system inputs which are within a certain range of system inputs are important in exciting each one of the second-level nodes j. The choice of the number of second-level nodes to use also incorporates knowledge of the number of relevant peaks to expect. Other membership functions can incorporate the same knowledge—generally any membership function whose value is 0 (or approaches 0) for all of the first-level nodes i outside a trainable range of i will incorporate this knowledge. Such functions are especially useful where the input channels represent a spectrum to be analyzed. The above functions are also "convex" in the fuzzy logic sense, meaning they have no local minima. See Kaufmann, et al "Introduction to Fuzzy Arithmetic", Van Nostrand Reinhold Company (1985), pp. 8–15, especially page 11. This characteristic is also advantageous for spectrum analysis.

The above sample fuzzy membership functions can be generalized by defining $$w_{i,j} = w_j(i, p_{j,1}, \ldots, p_{j,P_n}),$$

where the p's are the parameters that are trained. Preferably, but not necessarily, the number of trained parameters $P_n$ in the membership function is less than the number of nodes in the prior level of the neural network; otherwise there is no reduction in the number of parameters to be trained.

The expert knowledge used to choose the number and shape of membership functions need not be precise. In fact it is often abstract because it is a "gut" feeling from the expert's past experiences. For example, the expert may declare that to fully characterize a particular plasma system only ten optical peaks are needed but it is not known where the peaks should be located among the many possible optical channels. Note that even the expert's "guess" does not need to be exactly accurate because the system can later be redesigned with fewer or more filters. The expert may believe that for a particular application, the shape of the peak should be somewhat bell-shaped, without knowing exactly which parameters should characterize the bell-shaped function. In other words, while the shape and number of filters used for an application can be chosen from an expert's intuitive "guess", they need not be strictly accurate.

Note that whereas the described embodiments use fuzzy membership functions between the first and second levels of a neural network, in general the connection weights from the (n-1)'th to the n'th layer of the neural network can use the fuzzy filter. Thus in general, for all nodes j in such an n'th layer, $$w_{n,i,j} = w_{n,j}(i, p_{n,j,1}, \ldots, p_{n,j,P_n}).$$

The invention can be used with a wide variety of neural network architectures, including feed-forward-only neural networks (i.e. none of the node output values in one layer influences any output value in a prior layer), recurrent networks (e.g. networks which incorporate some feed-back between layers), networks in which the outputs of individual nodes are provided to nodes in more than one other layer, networks which use back-propagation for a teaching mechanism, networks in which the determination of trainable parameters is made off-line and only the resulting parameter sets are written into the network, networks which are implemented in hardware and networks whose functions are simulated in software, and so on. Non-neural network architectures can also be used, as long as the system is capable of learning.

As mentioned in the parent application, for the embodiment involving spectral analysis, the parameters which become set in the membership functions after training can be expected to reveal the most important input channels so as to provide a meaningful interpretation of the qualitative aspects of the analysis. In addition to the benefits mentioned above, the results at the same time provide a meaningful interpretation of the data in order to better understand the sophisticated nature of the spectrum being analyzed. Stated more generally, in addition to enabling abstract knowledge to be incorporated into the system, apparatus according to the invention can also be used as an important tool to help develop abstract knowledge from the system.

In order to use the apparatus as such a tool, the user would first select a form of membership function believed appropriate to parameterize the input data. For the example of spectral analysis, the selected membership function may be a bell-shaped function whose trainable parameters define the center-wavelength and the width of a set of the input signals. N neurons are then implemented in a second layer of an adaptive network, where N is the expected number of bins believed needed to define a higher order classification of the input data. In the spectrum example, N may be chosen as the number of spectral lines believed to be significant for purposes of the classification. N may be chosen to be larger than the minimum number of spectral lines believed to be significant, in case the belief was incorrect. The system is then trained, resulting in a trained parameter set for each of the fuzzy membership nodes (filters). These results indicate a higher order understanding of the input data. In the spectrum example, assuming N was large enough, the results indicate which spectral lines are actually important to the classification, the breadth of such spectral lines, and potentially also the number of such spectral lines. Moreover, the tool can be used iteratively to develop increasingly higher orders of information about the original signal data.

Thus in addition to improving learning efficiency of a neural network and incorporating already-known abstract information about the nature of the input data, the invention can also be used as an important tool for developing abstract information about a set of input data.

In summary, the invention permits the incorporation of higher order or abstract human or expert knowledge into a learning apparatus and thus can simplify the learning process as well as improve the prediction accuracy of the system or its capability to generalize because of the great reduction of the number of learning parameters to represent the system. The invention also permits a system to select or to identify relevant information from a vast pool of information and thus improve human capability to understand the system under study by the automatic capability of the system to self-position the filters and thus extract the correct information. Furthermore, the shapes of the filters modified automatically through the learning process will further reveal high-order information about the behavior of the system under study.

BRIEF DESCRIPTION OF THE DRAWINGS

The invention will be described with respect to particular embodiments thereof, and reference will be made to the drawings in which.

DETAILED DESCRIPTION

Figure 1:
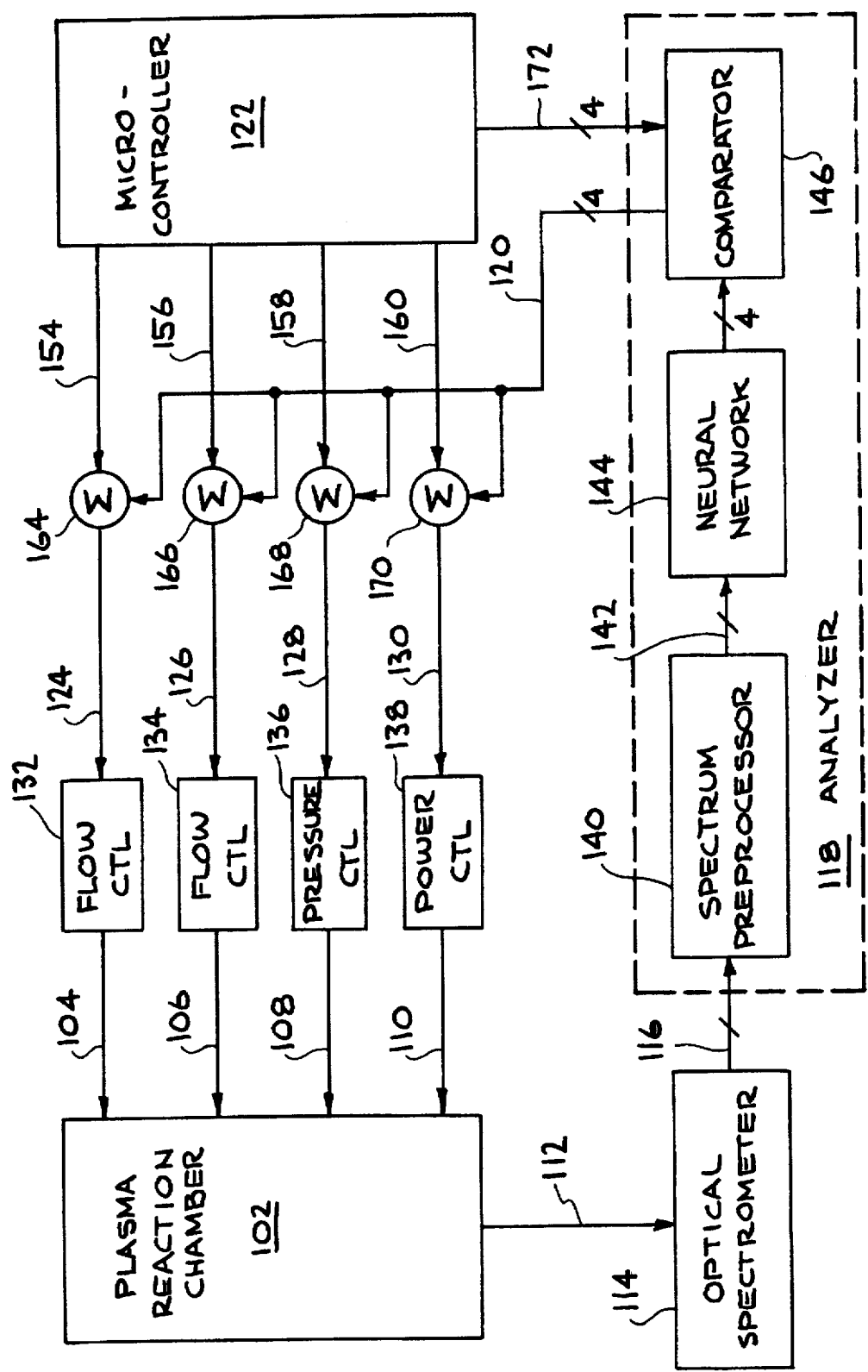
FIG. 1 is a symbolic block diagram of a plasma-based processing control system which incorporates features of the invention.

The following references are incorporated herein by reference:

Compton & Landon, "Parallel Detection Systems Offer Advantages Beyond the Obvious", Applications Review, published by Tracor Northern (1985);

Hirose, et al., "Back-Propagation Algorithm Which Varies the Number of Hidden Units, Neural Networks (1991), Vol. 4, pp. 61–69;

Jang, Jyh-Shing R., "ANFIS: Adaptive-Network-Based Fuzzy Inference System", IEEE Transactions on Systems, Man and Cybernetics (May/June 1993), Vol. 23, No. 3, pp. 665–685;

Jang, Jyh-Shing R., "Fuzzy Modeling Using Generalized Neural Networks and Kalman Filter Algorithm", Proceedings of the 9th National Conference on Artificial Intelligence (7/91), pp. 762–767;

Jenkins, et al., "The Modeling of Plasma Etching Processes Using Response Surface Methodology", Solid State Technology Journal (1986), Vol. 29, No. 4, pp. 175–182;

Kaufmann, et al., "Introduction to Fuzzy Arithmetic", Van Nostrand Reinhold Company (1985), pp. 8–15;

Lawrence, J., "Data Preparation for a Neural Network", AI Expert, November 1991, pp. 34–41;

Lee, C. C., "Fuzzy Logic in Control Systems: Fuzzy Logic Controller—Parts I and II", IEEE Transactions on Systems, Man, and Cybernetics, March/April 1990, Vol 20. No. 2, pp. 404–435;

Lippmann, R. P., "An Introduction to Computing with Neural Nets", IEEE ASSP Magazine, April 1987, pp. 4–22;

Malchov, D. S., "Characterization of Plasma Processes with Optical Emission Spectroscopy", SPIE, Advanced Techniques for Integrated Circuit Processing (Oct. 4, 1990), Vol. 1392, pp. 498–505;

Rigler, et al., "Rescaling of Variables in Back Propagation Learning", Neural Networks (1991), Vol. 4, pp. 225–229;

Singer, P. H., "Diagnosing Plasmas and Detecting Endpoints", Semiconductor international (August 1988), pp. 66–70;

Sun, et al., "Fuzzy Modeling Based on Generalized Neural Networks and Fuzzy Clustering Objective Functions", Proceedings of the 30th IEEE Conference on Decision and Control (1991);

Sze, S. M., "VLSI Technology", 2d. Ed. (1988), entire book;

Tracor Northern, "The Role of Photodiode Array Detectors in 'Snap-Shot' Spectroscopy" (1985);

Weir, M. K., "A Method for Self-Determination of Adaptive Learning Rates in Back Propagation", Neural Networks (1991), Vol. 4, pp. 371–379;

Zadeh, L. A., "Fuzzy Logic", IEEE Computer (1988), pp. 83–93;

Zadeh, L. A., "Fuzzy Sets", Information and Control (1965), Vol. 8, pp. 338–353;

Sun, Jang and Fu, "Neural Network Analysis of Plasma Spectra", Proceedings of the 1993 International Conference on Artificial Neural Networks (1993) pp. 968–972; and C. T. Sun, T. Y. Shuai and G. L. Dai, "Using Fuzzy Filters as Feature Detectors," Proceedings of IEEE International Conference on Fuzzy Systems, June 1994, Vol. I, pp. 406–410.

As used herein, a subscript on a function name permits different functions for different values of the subscript. For example, a function designated $f_k(\ldots)$ permits entirely different functions f for different values of k. $f_1$ may be a linear function, for example, while $f_2$ may be a sigmoid function. The omission of a particular subscript from the function name, on the other hand, indicates that the function is the same for all values of the omitted subscript. For example, the concept that all nodes j in a layer k have the same node function $f_1$, can be written as:

$$y_{k,j} = f_k(\ldots),$$

where $y_{k,j}$ is the output value of node j in layer k.

Also as used herein, the inclusion of a particular variable in the parameter list for a function indicates that the function output is responsive to that variable. That is, for at least one combination of values of the other Variables in the parameter list, at least one value of the particular variable produces a different function output value than does another value of the particular variable. The omission of a particular variable from the parameter list for the function indicates that the function output is not responsive to the omitted variable. That is, the function will always produce the same output value for the same set of values for variables which are in the parameter list, regardless of the value of the variable which is omitted from the parameter list. Thus, for example, the function $f(i, p_1, p_2, p_3)$ is responsive to the values of variables i, $p_1$, $p_2$ and $p_3$, but not to the value of a variable $p_4$ (unless, of course, one of i, $p_1$, $p_2$ and $p_3$ is itself responsive to $p_4$).

An embodiment of the invention was described in the above-incorporated parent patent application. For completeness, that description is repeated below.

FIG. 1 is a symbolic diagram of a plasma-based process control system which may incorporate features of the invention. It comprises a plasma reaction chamber 102 in which a plasma is formed in response to four input parameters 104, 106, 108 and 110. Other input parameters (not shown) such as excitation frequency and temperature also exist, but although they can be controlled in a different embodiment, they are not controlled in this embodiment of the techniques described herein. The symbolic lines 104 and 106 in FIG. 1 may be, for example, tubes carrying respective input gases at respective flow rates. The symbolic line 108 may represent a pipe through which gasses are added to or removed from the plasma reaction chamber 102 in order to maintain a desired operational pressure level, and the symbolic line 110 may represent a power connection to plasma excitation electrodes of the reaction chamber 102.

The reaction chamber 102 comprises a quartz window (not shown) through which the electromagnetic spectrum produced by a plasma in the chamber 102, just above the subject surface, may be viewed. The spectrum is conducted preferably by an optical fiber 112 to an optical spectrometer 114. The optical spectrometer 114 measures the intensity of the incoming optical spectrum at 1024 different wavelengths ("channels"), with a wavelength resolution of 0.59 nm. An example of an adequate spectrometer is the Model TN-6650, manufactured by Tracor Northern, Middleton, Wis. (now known as Noran Instruments, Inc.). This spectrometer is described in Tracor Northern, "The Role of Photodiode Array Detectors in 'Snap-Shot' Spectroscopy", incorporated herein by reference. See also Compton & Landon, "Parallel Detection Systems Offer Advantages Beyond the Obvious", Applications Review, published by Tracor Northern (1985).

The output of optical spectrometer 114 is provided electronically over a bus 116 to an analyzer 118, which analyzes the electronically represented spectrum and produces a plurality of error signals over lines 120. The error signals each indicate to a microcontroller 122 whether a respective one of the input parameters to the plasma reaction chamber 102 is to increased or decreased. A microcontroller 122 provides signals in a conventional manner over lines 154, 156, 158 and 160 to control respective controls 132, 134, 136 and 138, but these lines are intercepted and provided as inputs to respective summers 164, 166, 168 and 170. The second input of each of the summers receives a respective error signal from lines 120, and the summer outputs are connected over respective lines 124, 126, 128 and 130 to controls 132, 134, 136 and 138. The control 132 is a flow controller which adjusts the flow rate of one of the input gases to the plasma reaction chamber 102. The control 134 is also a flow controller which controls the flow rate of another of the input gases to reaction chamber 102. The control 136 is a pressure controller which controls the pressure in reaction chamber 102, and control 138 is a power controller which controls the plasma power applied to generate the electric excitation field in the plasma reaction chamber 102. Although four particular input parameters are shown for the plasma reaction chamber 102, it will be understood that a smaller or larger number of such parameters could be controlled in a different embodiment. Note that the error signals 120 could be provided directly to the microcontroller 122 instead of to inserted summers, but the use of inserted summers permits an existing control system to be adapted with only minor modification. This is desirable especially where the microcontroller 122 performs other production tasks as well as controlling chamber 102. It is also desirable because facilitates easy upgrade of existing field equipment.

Analyzer 118 comprises an optional spectrum preprocessor 140, which receives the electronically represented plasma spectrum over bus 116 and preprocesses it to reduce background information and filter out any biases in the data. As will be seen, the spectrum preprocessor 140 is not always necessary to the effectiveness of the system. For example, if there are no biases affecting the accuracy of the received spectrum, then it may be possible to omit the preprocessor with the only consequence being a more lengthy training period to overcome background signal.

The output of the spectrum preprocessor 140 is provided over a bus 142 to the input nodes of a neural network 144. Neural network 144 may have any of a wide variety of known network architectures including those mentioned above and those incorporated by reference.

In the analyzer 118 of FIG. 1, the output bus 142 of spectrum preprocessor 140 is connected to the excitation inputs of respective first-level neurons in the neural network 144. The neural network 144 may be a three-level network, for example, whose synaptic weights have been set according to the correspondence between plasma spectra and the input parameters in response to which each plasma is formed. Thus the neural network 144 performs a conversion between the input spectrum on bus 142 and a set of signals predicting the input parameters in response to which the plasma was produced.

Figure 6:
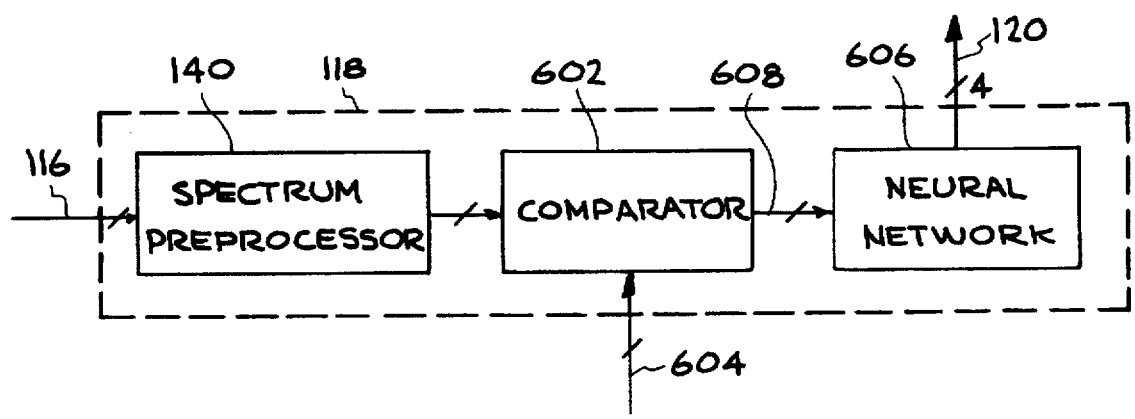
FIG. 6 is a symbolic block diagram of an alternative analyzer of FIG. 1.

The analyzer 118 further contains a comparator 146 which compares the input parameter values predicted by neural network 144 with a set of desired values which are known to produce an optimum plasma. Such desired values my be provided by microcontroller 122 over lines 172. The comparator outputs the result of these comparisons as a set of error signals on the lines 120 to the summers 164, 166, 168 and 170 which appropriately modify control signals 154, 156, 158 and 160 from the microcontroller 122 in a conventional manner. The comparator 146 may be microprocessor-based, may be hardwired, and/or may be included as part of the software in microcontroller 122. (Note that it is possible to include the functions of the entire analyzer 118, the summers and the microcontroller 122, all in software running on a microcomputer, or in a neural network controller, or in a combination of both.) FIG. 6 shows another example of an analyzer 118 in which the output of preprocessor 140 is provided first to a comparator 602, which compares the preprocessed spectrum signals to a desired set of spectrum signals provided over lines 604. The difference signal outputs (one for each channel) are provided over lines 608 to a neural network 606, which generates the error signals over lines 120.

The operation of the controller of FIG. 1 will be described with respect to a semiconductor process step which involves reactive ion etching (RIE) of an oxide in a batch-type parallel-plate reactor, processing several wafers per run. To illustrate the effectiveness of the controller, a particularly difficult set of gases is chosen for the production of the plasma. In particular, the combination of $CHF_3+H_2$ is used to form the plasma, a combination in which it is usually difficult to obtain repeatable results due to high polymerization.

In order to determine the synaptic weights to be programmed into the neural network 144, a series of experiments is conducted. The statistical technique of response surface methodology (RSM) may be used to select the particular experiments to be performed. RSM is described in Jenkins, et al., "The Modeling of Plasma Etching Processes Using Response Surface Methodology", Solid State Technology Journal, Vol. 29, No. 4, pp. 175–182 (1986), incorporated by reference herein. In particular, the center cube experimental design methodology is used to select 30 experiments to perform, six of which are repetitions. For the present illustration, the four input parameters are permitted to vary over exceedingly wide ranges as follows:

$CHF_3$ flow rate=70–110 sccm $H_2$ flow rate=0.0–4.0 sccm

Pressure=50–70 mTorr

Rf power=400–800 Watts

These input parameter ranges permit oxide etch rates from about −45 through 800 Å per minute, amorphous silicon etch rates of −5 through 60 Å per minute, and an etch selectivity of 7–35. From these ranges, the following 30 experiments are performed:

| Trial No. | H₂ Flow Rate (sccm) | CHF₃ Flow Rate (sccm) | Power (Watts) | Pressure (mTorr) |
|---|---|---|---|---|
| 1 | 2 | 90 | 600 | 60 |
| 2 | 1 | 80 | 700 | 55 |
| 3 | 1 | 100 | 500 | 55 |
| 4 | 3 | 100 | 500 | 65 |
| 5 | 1 | 100 | 700 | 65 |
| 6 | 2 | 90 | 600 | 60 |
| 7 | 1 | 80 | 500 | 65 |
| 8 | 3 | 100 | 700 | 55 |
| 9 | 3 | 80 | 500 | 55 |
| 10 | 3 | 80 | 700 | 65 |
| 11 | 3 | 100 | 500 | 55 |
| 12 | 2 | 90 | 600 | 60 |
| 13 | 1 | 100 | 500 | 65 |
| 14 | 3 | 80 | 700 | 55 |
| 15 | 1 | 80 | 700 | 65 |
| 16 | 3 | 80 | 500 | 65 |
| 17 | 3 | 100 | 700 | 65 |
| 18 | 1 | 100 | 700 | 55 |
| 19 | 1 | 80 | 500 | 55 |
| 20 | 2 | 90 | 600 | 60 |
| 21 | 2 | 90 | 600 | 60 |
| 22 | 4 | 90 | 600 | 60 |
| 23 | 2 | 90 | 800 | 60 |
| 24 | 2 | 90 | 600 | 60 |
| 25 | 2 | 90 | 400 | 60 |
| 26 | 2 | 90 | 600 | 50 |
| 27 | 0 | 90 | 600 | 60 |
| 28 | 2 | 70 | 600 | 60 |
| 29 | 2 | 90 | 600 | 70 |
| 30 | 2 | 110 | 500 | 60 |

Once the characterization experiments are determined, they are each performed on the actual equipment by having the microcontroller 122 supply the input parameters for each particular experiment to the inputs of the controls 132, 134, 136 and 138 such that the plasma responsive to the specified input parameters is actually formed in the reaction chamber 102. The system and each of its essential components must be operating correctly and be accurately calibrated for these experiments. The summers 164, 166, 168 and 170 are either temporarily removed or their second inputs are held at zero. Actual spectral data is obtained for each experiment and the neural network parameters are determined as hereinafter described.

Figure 2:
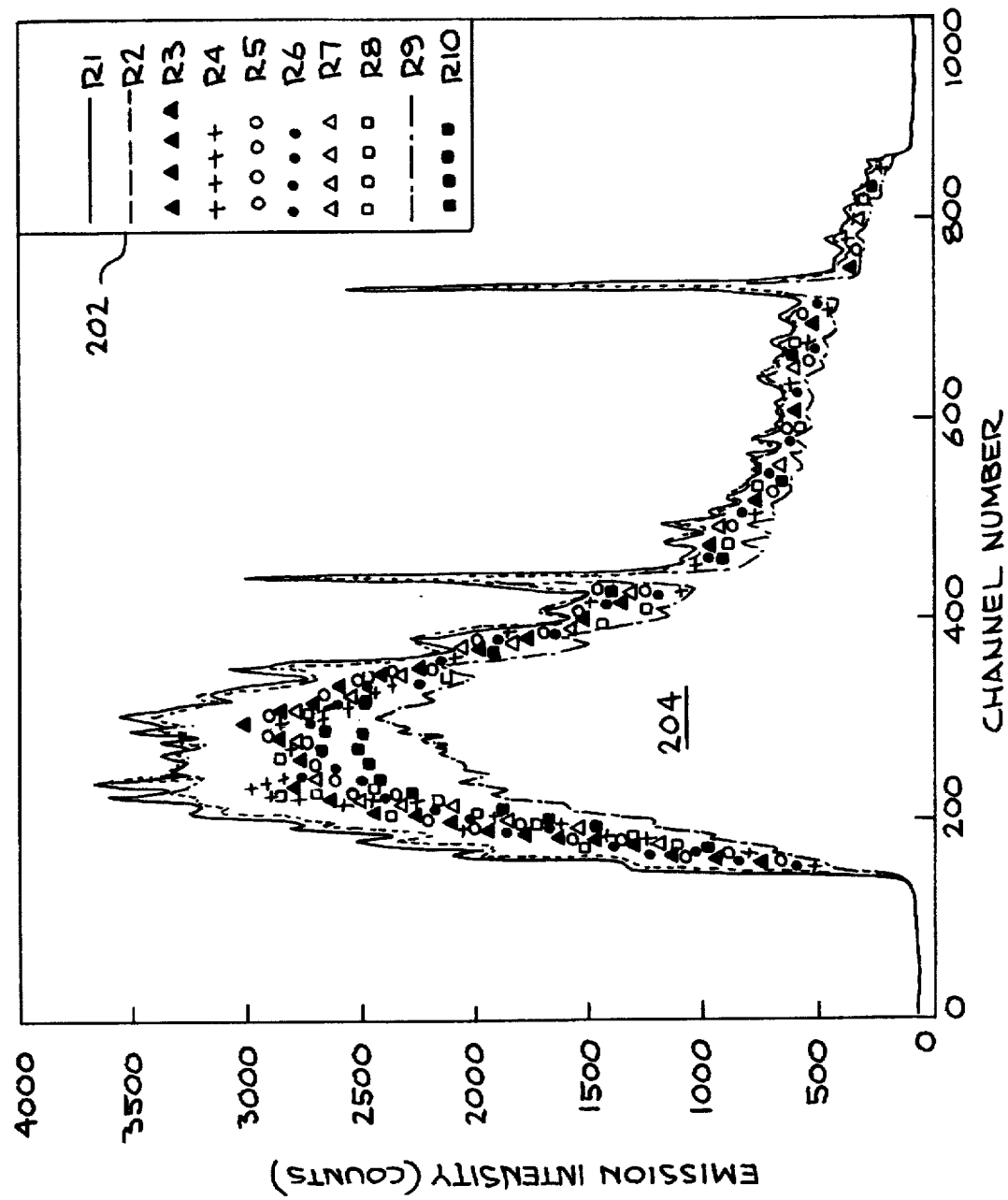
FIG. 2 is a plot of plasma spectra produced in response to several experimental sets of input parameters.

FIG. 2 is a plot of the spectrum output 116 of optical spectrometer 114 for nine of the experiments as indicated in the key 202. In the plot of FIG. 2, each of the channel numbers on the horizontal axis each cover a different wavelength in the optical spectrum produced by the plasma in reaction chamber 102, and the vertical axis represents the intensity of electromagnetic radiation detected at the wavelength of each channel. As can be seen from FIG. 2, because of the particular grating and spectrometer used, the only channels which contain any data are those from approximately channel 140 through approximately channel 870. There are, in fact, only 721 (or 731) channels which contain useful data. Accordingly, although the optical spectrometer 114 analyzes 1024 channels, only 721 need be provided over bus 116 to the analyzer 118. The grating used is Model No. TN-6049-EG9, manufactured by Tracor Northern, and the detector is Model No. TN-6144, by the same manufacturer.

It can also be seen from FIG. 2 that a large area 204 contains only background information which does not change for the different ones of the experiments. Accordingly, the spectrum preprocessor 140 should desirably remove this background information to provide the neural network 144 excitation inputs with the widest possible dynamic range. Such background information can be largely cancelled with the following formula:

$$O_i = (I_i - A_i)/A_i,$$

where $I_i$ is the input intensity value for channel i;

$A_i$ is the nearby average intensity value for a small range of channels bracketing channel i, for example, $I_{i-5}$ through $I_{i+5}$; and $O_i$ is the preprocessed output intensity value for channel i.

Another possible background cancelling formula is $O_i = I_i - A_i$. Still another possible formula is $O_i = I_i/I_{i-1}$. None of these formulas is perfect, but as previously mentioned, any imperfections are accommodated in the weightings which will be learned by the neural network.

Although not shown in FIG. 2, the spectrum produced by optical spectrometer 114 is also undesirably affected by polymer deposited by the plasma on the inside surface of the quartz window through which the plasma is viewed. The deposited polymer forms a non-uniform filter as a function of frequency which is desirably compensated by the spectrum preprocessor 140. It can be seen that the first of the preprocessing formulas set forth above will remove most of the effect of the polymer filter. Again, any imperfections in the formula can be accommodated in the weightings programmed into the neural network 144. In this learning step, if the weightings are determined by a software simulation rather than a learning mode of an actual neural network, then the spectrum preprocessor functions can be performed off-line before being provided to the software simulator.

Figure 3:
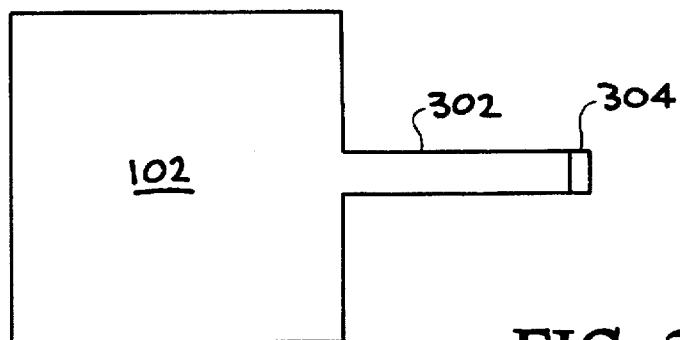
FIG. 3 is a symbolic diagram of a plasma reaction chamber.

Although the preprocessing and the neural network 144 can compensate for or accommodate polymer filtering, it is preferred that the filtering be avoided in the first instance. This can be accomplished with a reaction chamber 102 designed as shown in cross-section in FIG. 3. In particular, the reaction chamber includes a narrow tube 302 which is in direct communication with the interior of the chamber 102, and which terminates with the quartz window 304. The optical spectrum produced by the plasma passes through the tube 302 before it reaches the quartz window 304. In this arrangement, the tube 302 can be made narrow and long enough such that any polymer formed by the plasma which enters the tube 302 deposits on its interior surfaces rather than on the inside surface of quartz window 304.

Figure 4:
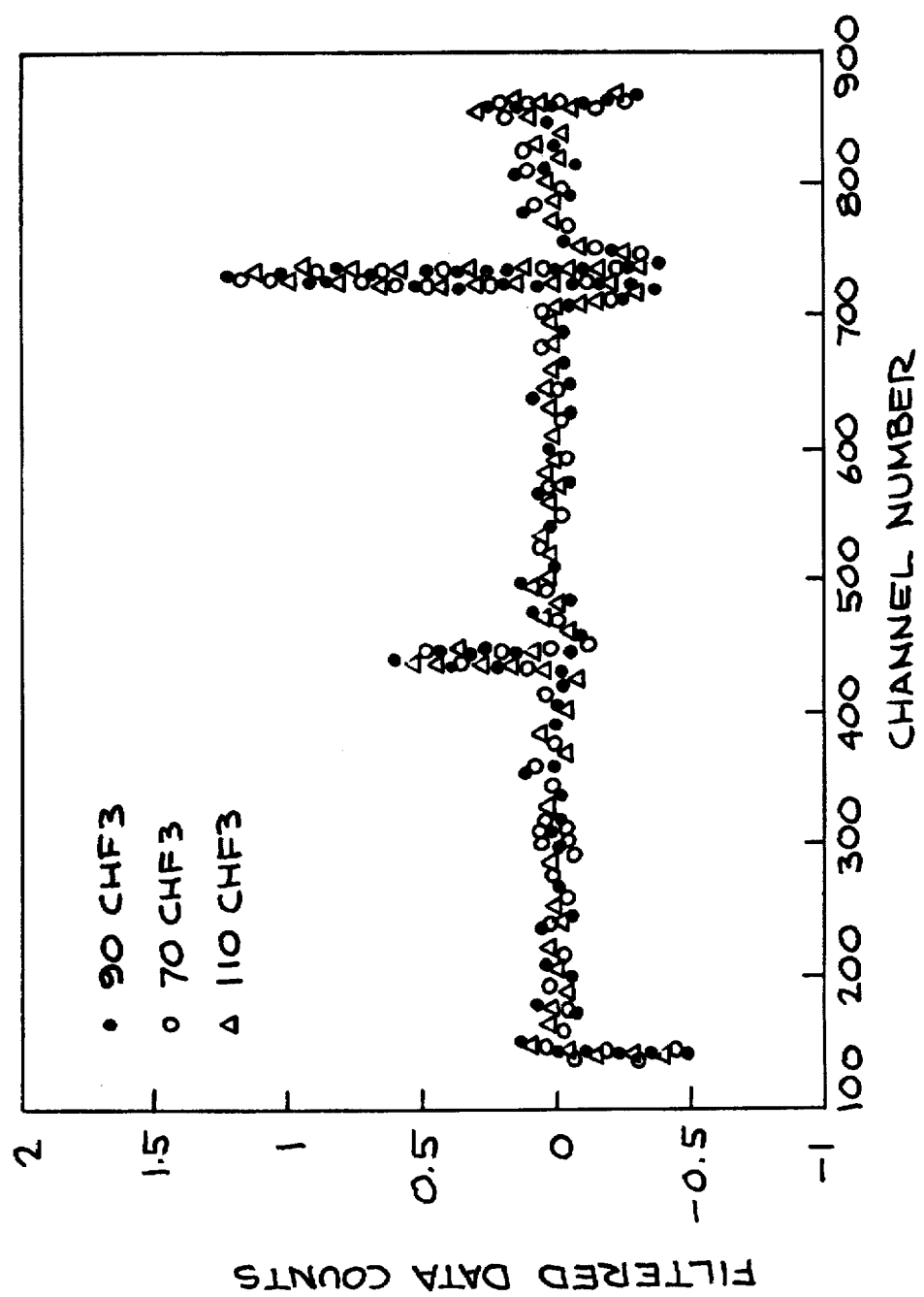
FIG. 4 is a plot showing the spectrum output of the preprocessor of FIG. 1 in response to several of such experiments.

FIG. 4 is a plot showing the spectrum output of preprocessor 140 for three of the experiments, preprocessed in accordance with the first-mentioned preprocessing formula set forth above. As can be seen, the spectra are virtually identical for the three plasmas, and therefore virtually impossible for a human being to distinguish and thereby control the plasma etching step.

After a preprocessing algorithm is determined, the experimental data preprocessed thereby and the resulting spectrum are used to teach the neural network. If the neural network 144 is of the self-learning type, then it is placed in its learn mode and allowed to learn what its inputs would look like for the outputs which it would be expected to generate for each set of experimental data. If the neural network 144 is not of the self-learning type, then suitable simulation software may be used to simulate the learning process. An adequate off-the-shelf software package which can be used for this purpose is entitled "NeuralWorks Professional II/Plus", manufactured by NeuralWare, Inc., Pittsburgh, Pa.

Figure 5:
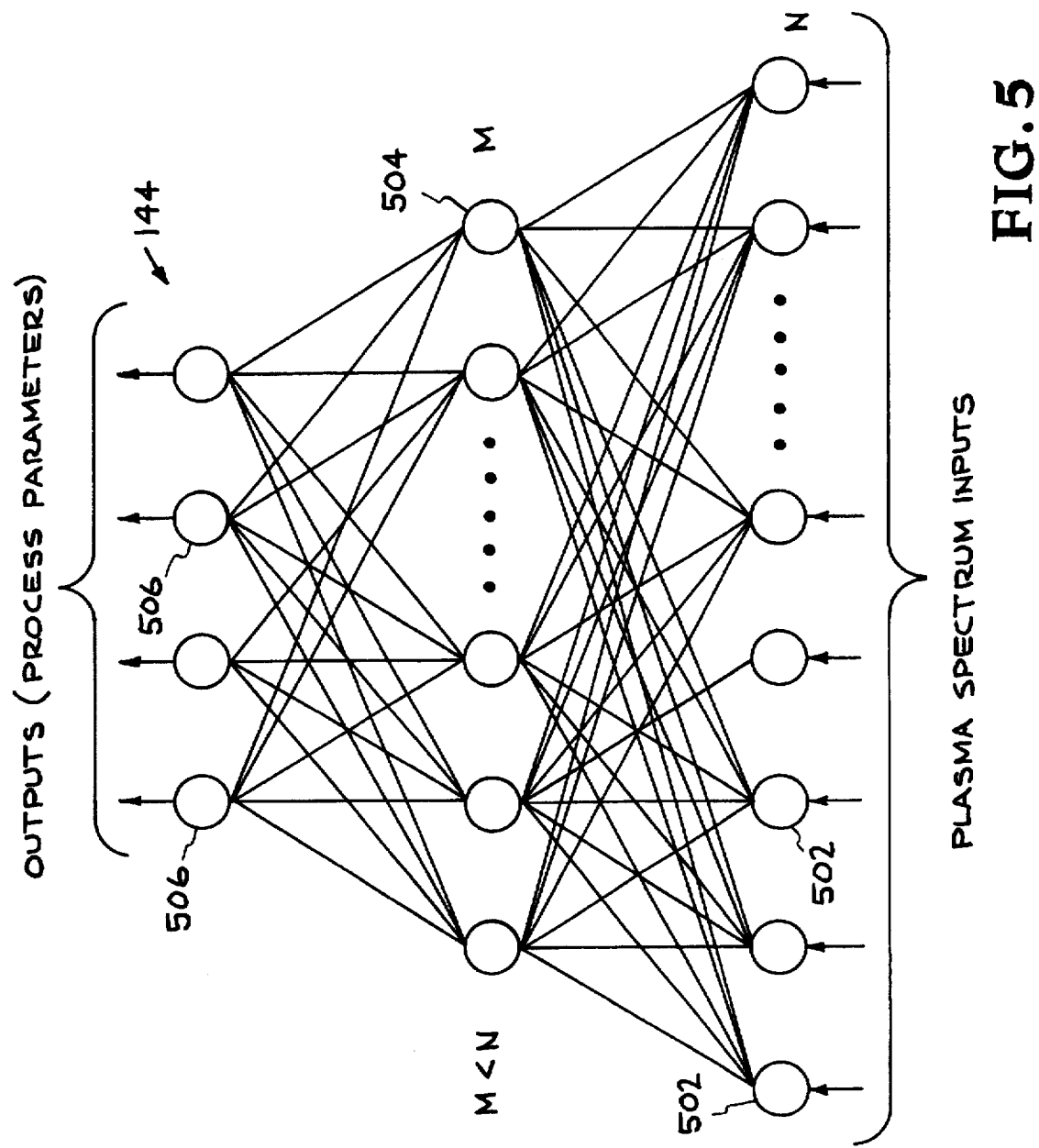
FIG. 5 is a symbolic diagram of a neural network topology.

For the purposes of the present illustration, a three-level neural network 144, with fixed Weights and without feedback, is selected. The topology of such a network is shown in FIG. 5. As shown, the neural network 144 has N input excitation inputs 502, M second-level neurons 504 (M<N), and four output neurons 506. Since only 721 input channels contain useful information, only 721 neurons 502 (N=721) are needed for the neural network 144. Further, for this illustration, M is chosen as M=8 second-level neurons. The total number of neurons in neural network 144, therefore, is only 743.

After the software simulations described above are used to determine the synaptic weights for the neural network 144, it is often useful to examine a Hinton diagram of the weights thus determined. In the present illustration, examination of the Hinton diagram reveals that the network considers only a few groups of the input channels as significant in its determination of a set of the input parameter values, and the species related to the groups are the derivatives of H, F, C, N, O. Since the system is not leak-tight, the presence of N and O is expected. All the remaining input excitation neurons 502 of the neural network 144 and their associated weights may therefore be omitted to reduce the complexity of the control system. The spectrum preprocessor 140 also need not preprocess the channels which will not ultimately be provided to the neural network 144, and the optical spectrometer 114 need not provide them (other than as necessary to accomplish any nearby averaging used in the preprocessor formula). This will also improve the response of the optical spectrometer. For example, when only H is allowed to vary, the learning process identifies only three groups of input neurons whose synaptic connections to the second-level neurons have significantly non-zero weights. The three groups of input neurons determined by the learning process to be significant, correspond to the wavelengths of two hydrogen spectral peaks and one wavelength which does not appear to correspond to a spectral peak of hydrogen. The network's consideration of the last-mentioned group, occurring at about wavelength $\lambda=429.34$ nm, was unexpected. But the possibility that this spectral line corresponds to CH is a reasonable one since excessive $H_2$ will increase polymerization and thus the occurrence of the CH line. Thus the CH line may be a more sensitive indicator for conditions where $H_2$ flow is high. The ability of neural networks to select the most pertinent channels to help distinguish the various plasmas, without any guidance from human experts and without needing any explicit rules specified for the plasma diagnostics, illustrates another reason why the use of a neural network in a plasma-based process step control system is advantageous.

The Hinton diagram also reveals a channel broadening for spectral line identification, meaning that the neural network considered relevant not only the particular channel in which the identified spectral peaks are located, but also several channels on either side as well. It is believed that such channel broadening may have occurred due to possible drift in the spectrometer 114. Again, the ability of a neural network to accommodate such drift further illustrates the value of the use of a neural network in a plasma-based processing step control system.

Once the synaptic connection weights are programmed into neural network 144, the closed-loop control system of FIG. 1 can operate to closely control the plasma formed in the plasma reaction chamber 102 to accomplish RIE oxide etching. Additionally, the microcontroller 122 (or another component) can keep a history file of the error signals generated over the lines 120, analyzing trends and signaling when a failure is likely or when adjustment is required. Maintenance and repair can then be predicted in advance and be performed on the equipment at a time when it will least impact the manufacturing schedule.

In the above example of a $CHF_3+H_2$ RIE oxide etching process step, using the above-mentioned 30 experiments to determine synaptic interconnection weights for a three-level neural network, the neural network output signals predict the input parameters for a given plasma very accurately. The RMS deviation between the true input parameters and the neural network output values, over all 30 training experiments, are as follows:

| Parameter | RMS Deviation |
|---|---|
| $H_2$ gas | 0.29% |
| $CHF_3$ gas | 0.19% |
| Power | 0.33% |
| Pressure | 0.25% |

Additional numbers of neurons may be added to the hidden layer of the neural network 144 to further increase the accuracy of these results, but probably at the expense of some of the generalizing ability of the neural network. The RMS deviation between the output signals of the neural network 144 and actual process input parameter values increases to about 20% for plasma spectra which the neural network 144 has not previously seen. Such a large error for unseen data is still tolerable, however, as long as the direction of required adjustment is accurate. The large error for unseen data is explainable in part by the difficulty of the particular plasma chosen for the illustration, as well as by the large parameter space within which the input parameter values were permitted to vary in the illustration and the limited number of experiments used. In a more realistic example in which $CHF_3$, $CF_4$ and He gases are used to produce the plasma, and in which the neural network controls the flow rates of such gases, the pressure in the chamber, and the power applied to the plates, and in which the parameter space is a much more reasonable ±5% of the target value, the resulting RMS deviation reduces to only about 4% for unseen data.

As explained above, one of the problems with using the neural network for a spectral analysis is the large number of input channels involved. For a neural network, the large number of input channels implies a very large number of parameters (weights) to be adjusted during the learning process. For example, a 731-8-4 node network includes 731×8+8×4=5880 parameters (excluding additional biasing parameters) which require adjusting. This results in a lengthy training period. Additionally, the neural network does not typically incorporate any abstract knowledge which may already be known about the problem being analyzed. The neural network 144 of FIG. 1 can accordingly be modified in order to include fuzzy filtering which addresses these problems. Fuzzy filtering is the task of partitioning a massive amount of physical channels into a much smaller number of fuzzy channels. These channels, adaptive during the training process, can perform both noise filtering and feature detection and selection. System parameters such as the membership functions defined for each fuzzy channel and the weights in the feed-forward network are calibrated with backward error propagation. Fuzzy logic is described in Zadeh, "Fuzzy Logic", IEEE Computer, pp. 83–93 (1988), incorporated by reference herein.

Fuzzy filtering assumes the boundary between two neighboring meaningful channels as a continuous, overlapping area in which an input channel has partial membership in both fuzzy channels. A fuzzy channel defines a range of input wavelengths characterized by an appropriate membership function. The position and shape of this membership function is parameterized, so that it can be adjusted during the learning process so that system error is minimized. At the end of the training, the position and shape of the membership functions can be expected to reveal the most important input channels so as to provide a meaningful interpretation of the qualitative aspects of the analysis.

Figure 7:
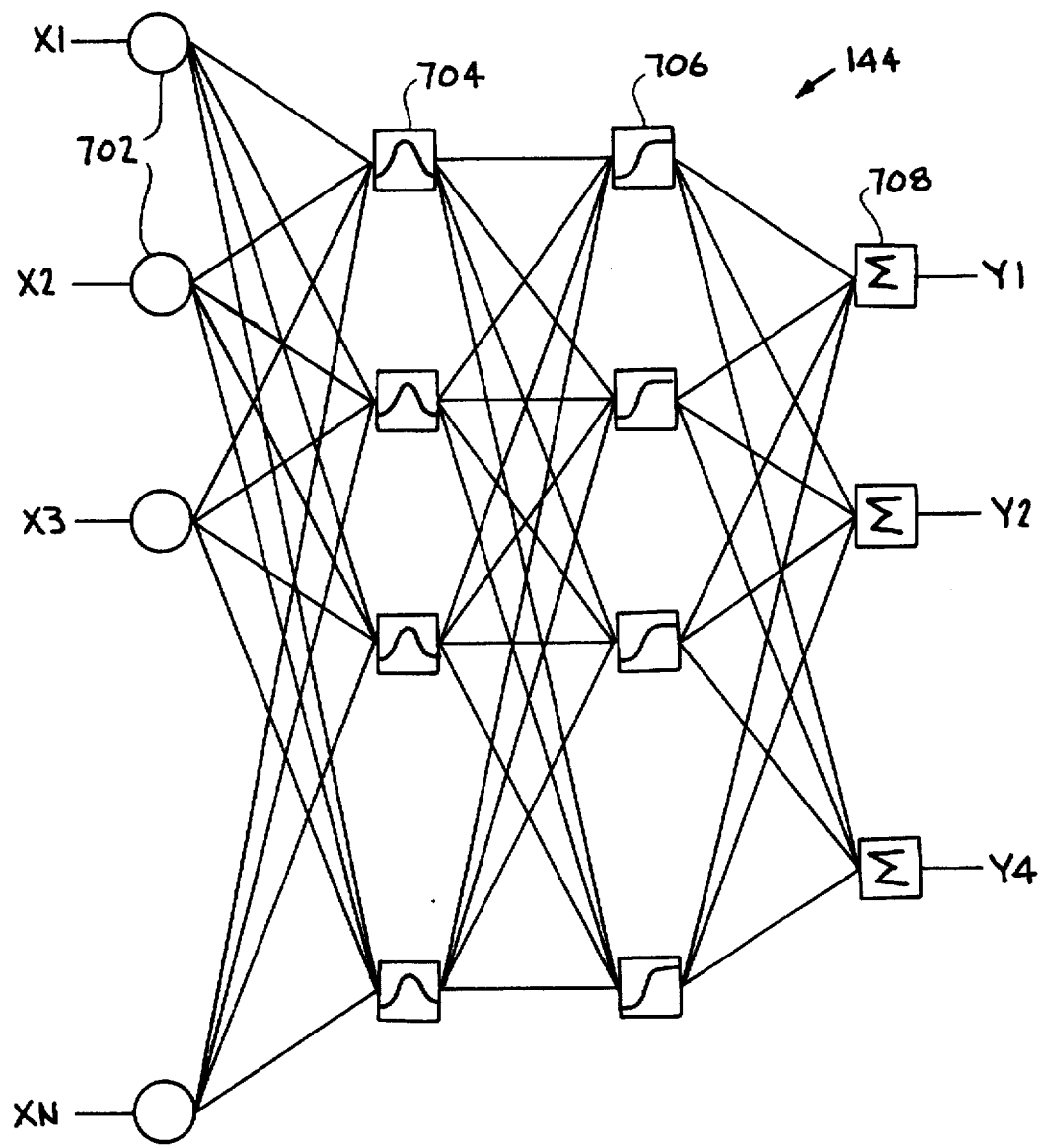
FIG. 7 is a symbolic block diagram of an alternative neural network of FIG. 1.

FIG. 7 shows the topology of a neural network 144 (FIG. 1) which incorporates fuzzy filtering. It includes N input excitation neurons 702, M second-level nodes 704 (M<N), L third-level neurons 706, and K output neurons 708. For a $CHF_3+H_2$ oxide etching process step, there may be 731 input nodes 702, eight second-level nodes 704, eight third-level nodes 706, and four output nodes 708.

Each node in the network of FIG. 7 performs a particular function (a "node function") based on the incoming signals and a set of parameters pertaining to the node. All the nodes in a given layer in this embodiment have the same type of node function. In particular, the nodes of layer one may simply be isolation buffers. Each of the nodes 704 in layer two is associated with a parameterized bell-shaped membership function given as:

$$\mu_j(i) = \frac{1}{1 + \left[\left(\frac{i-c_j}{a_j}\right)^2\right]^{b_j}},$$

where i is t channel number, j is the number of the particular second-level node 704, and the adjustable parameters are $a_j$, $b_j$ and $c_j$. The output signal from each of the i'th one of the first-level nodes 702 is therefore weighted by the function $\mu_j(i)$ in its connection to the j'th one of the second-level nodes 704. Each j'th one of the second-level neurons 704 then sums its weighted input values and divides by a normalization factor to produce an output signal. The node output is accordingly given by:

$$\frac{\sum_i \mu_j(i) x_i}{\sum_i \mu_j(i)}.$$

This can be rewritten as $$y_j = f\left(\sum_{i=1}^{N} w_j(i) x_i\right),$$

where f(any input)=1, N is the number of first-level neurons, the function $w_j(i)$ is defined as $$w_j(i) = \frac{\mu_j(i)}{U_j},$$

and the normalization factor $U_j$ is defined as $$U_j = \sum_{i=1}^{N} \mu_j(i).$$

The initial values of the parameters are set in such a way that the membership functions satisfy "$\epsilon$ completeness" (with $\epsilon$=0.5, for example), "normality" and "convexity". See "Introduction to Fuzzy Arithmetic: Theory and Applications", Arnold Kaufmann and Madan M. Gupta, Van Nostrand Reinhold Co., 1985, and "Fuzzy Logic in Control Systems: Fuzzy Logic Controller", C. C. Lee, IEEE Trans. on Systems, Man, and Cybernetics, 20(2):404–435, 1990. Although these initial membership functions are set heuristically and subjectively, they do provide an easy interpretation parallel to human thinking. The parameters are later tuned with backpropagation in the learning process based on the training data set. Better initial weightings can be designed by using the Central Limit Theorem to prevent saturation of the neural network.

The third layer nodes 706 perform as a hidden layer as in a standard neural network, taking weighted sums of the second-level node outputs and producing the transformed output through a sigmoidal function. The fourth-level nodes 708 are similar except for the omission of the transfer function because the output values are prescaled.

Note that with given values of the membership function parameters for second-level nodes 704, and P training data, P linear equations can be derived in terms of the parameters in the fourth-level neurons 708. These equations can be solved computationally by using the Kalman filter algorithm as described in "Fuzzy modeling based on generalized neural networks and fuzzy clustering objective functions", Chuen-Tsai Sun and Jyh-Shing Jang, in "Proceedings of the 30th IEEE Conference on Decision and Control", 1991. This technique can accelerate the learning process where learning is accomplished by computer simulation.

It can be seen that the use of a fuzzy filtering mechanism as shown in FIG. 7 simplifies the neural network architecture because far fewer system parameters need to be adjusted. In particular, in the architecture of FIG. 7, three parameters ($a_j$, $b_j$ and $c_j$) need to be adjusted for each of the M second-level nodes 704, in addition to M input weighting adjustments for each of the L third-level neurons 706, and L input weighting adjustments for each of the four output neurons 708. For N=731, M=8, L=8 and K=4, this results in only 3×8+8×8+8×4=120 parameters to be adjusted. For N=731, M=L=15 and K=4, only 330 parameters need to be adjusted (excluding bias weights). This benefits learning efficiency, and at the same time provides a meaningful interpretation for the training results in order to better understand the sophisticated nature of plasma emission because redundant spectral lines would then be eliminated.

Figure 8:
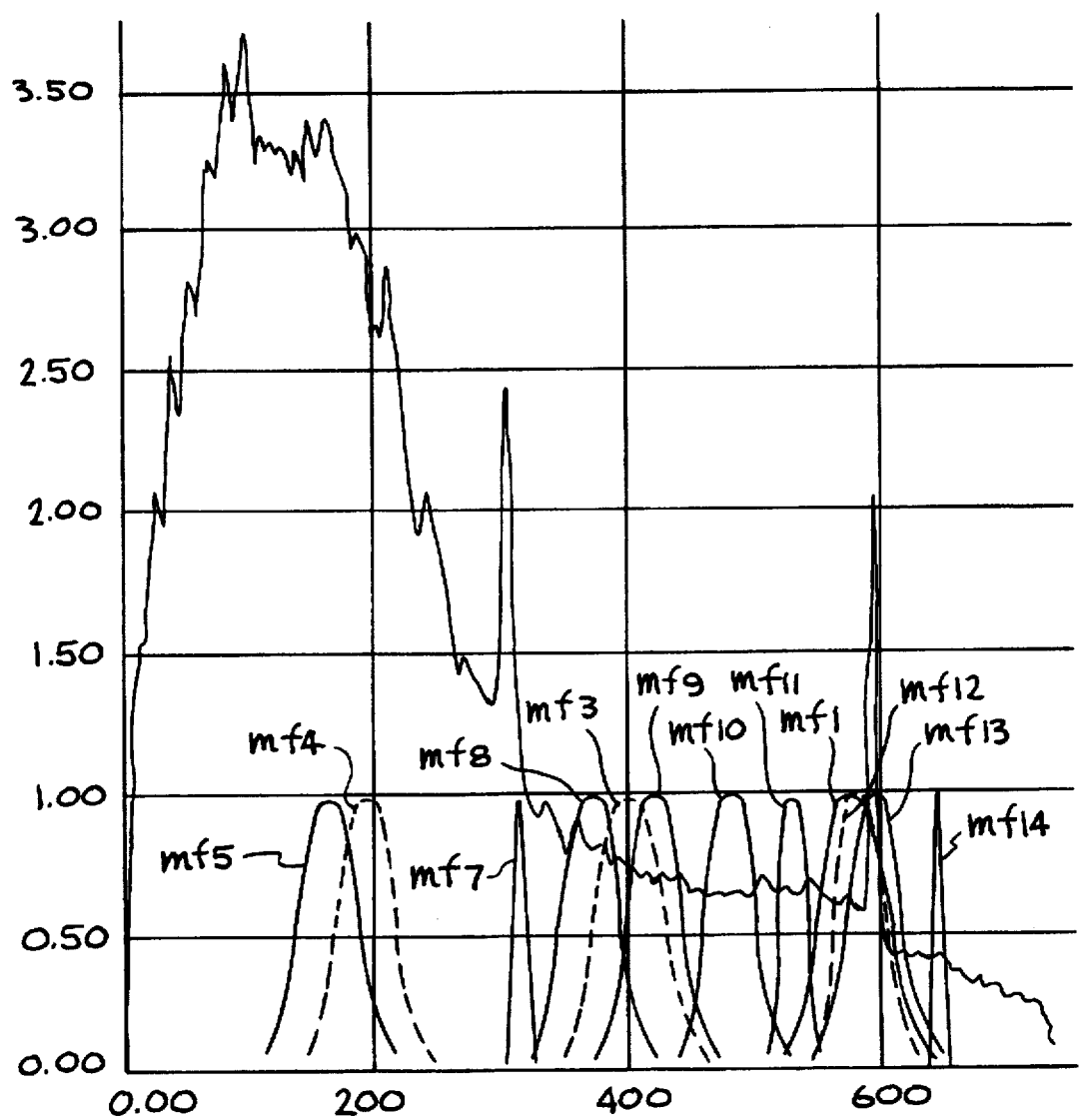
FIG. 8 is a plot of membership functions in the apparatus of FIG. 7, after training.

A plot is shown in FIG. 8 with the y-axis representing the (scaled) membership intensity of the plasma emission signal in a number of the membership functions after training. The x-axis represents the optical channel number, which corresponds to a wavelength of the optical spectrum emitted by the plasma in the plasma reaction chamber. Three channels were lost in the learning process (driven out of the wavelength range); the remaining ones are shown in the same figure and indicate, by their peaks, the wavelengths of species considered significant. The values learned by the different membership functions for parameters $a_j$, $b_j$ and $c_j$ are set forth in the Figure, and are repeated below for clarity. The species indicated by their peaks are also set forth below.

| Membership function (j) | $a_j$ | $b_j$ | $c_j$ | Species |
|---|---|---|---|---|
| 1 | 34.0 | 2.1 | 578.2 | CN |
| 3 | 29.0 | 2.0 | 399.2 | O |
| 4 | 27.3 | 2.0 | 191.7 | CN |
| 5 | 24.6 | 2.0 | 163.0 | N2 |
| 7 | 4.9 | 2.1 | 313.5 | H |
| 8 | 25.8 | 2.0 | 365.5 | CO |
| 9 | 24.8 | 2.0 | 417.6 | N2 |
| 10 | 22.7 | 2.1 | 477.6 | N2 |
| 11 | 10.3 | 2.1 | 527.9 | O |
| 12 | 14.5 | 2.4 | 577.7 | O |
| 13 | 7.5 | 2.4 | 595.5 | H |
| 14 | 3.6 | 2.3 | 643.3 | F |

For an etching process, the important channels are typically those that change dramatically as the etch proceeds. We can match the wavelengths to the species that emit them. The fuzzy channels automatically identified two hydrogen peaks and a CO emission line, see FIG. 8 and the table above. The nitrogen lines indicate a possible leak in the vacuum system, suggesting that the leak may play a role in this etching process.

In brief, the network actually learns on its own from the training data and selects the most pertinent channels without any guidance from human experts of plasma diagnostics. This ability of feature detection and selection is one of the advantages that fuzzy filtering mechanism provides us. This capability is significant because human experts can actually learn from the network and gain a better understanding of the system being analyzed.

This technique can also be used for spectrum or non-spectrum analysis in other fields such as medical diagnosis or global change, in which the explanation of the training results plays a role as important as the applicability of the working model.

As mentioned, the techniques described herein for controlling a plasma etching process step on a semiconductor wafer can easily be applied to most types of plasma-based processing steps for most surfaces. It can be used, for example, in the manufacture of active matrix liquid crystal displays, either in PECVD or sputtering steps, or in the formation of thin films such as those used in superconductors and in magnetic and optical storage surfaces.

In addition, the technique can be generalized to apply to processes which are not plasma-based, if appropriate input is provided to the neural network to characterize the reaction taking place. The input can be an optical frequency spectrum or another electromagnetic frequency spectrum, or it can be a non-frequency spectrum such as a mass spectrum produced by a residue gas analyzer (RGA). As another example, the input to the analyzer 118 can be an emission spectrum such as that produced by laser-induced fluorescence, or the spectra produced by colorimeters, photometers, spectrophotometers, atomic absorption spectrometers or by other techniques of absorption spectroscopy. The technique also can be generalized to the monitoring and control of processes other than semiconductors and superconductors. Furthermore, it can also be applied to the design of processes such as the design of new materials and drugs or medications. It can also be used as a tool for researchers for gaining knowledge of fundamental systems such as the human genome system and others by identifying relevant information from a set of possible information. It can also be used for optical character recognition.

The use of an adaptive fuzzy membership function is also extendable to other apparatus which does not include any other conventional neural network layers.

The invention has been described with respect to particular embodiments thereof and it will be understood that numerous modifications and variations are possible without departing from its scope.

We claim:

1. A neural network having a plurality of nodes each having an output carrying a respective output value y, said nodes being grouped into a plurality of layers including an input layer and an n'th layer different from said input layer, each k'th layer having $N_k$ nodes, and each j'th node in each k'th layer except said input layer producing its output value $y_{k,j}$ according to the node function $$y_{k,j} = f_k \left( \sum_{i=1}^{N_{k-1}} w_{k,i,j} y_{k-1,i} \right),$$

where i indexes the nodes of layer k-1 and all the $w_{k,i,j}$ are connection weights, wherein for all nodes j in said n'th layer, $$w_{n,i,j} = w_{n,j}(i, p_{n,j,1}, \ldots, p_{n,j,P_{n,j}}),$$

each of said $P_{n,j}$ being an integer greater than zero and less than the number of nodes $N_{n-1}$ in layer n-1, $N_{n-1}>1$, said network further comprising teaching means for setting values for at least one of $p_{n,j,1}, \ldots, p_{n,j,P_{n,j}}$ for each node j in said n'th layer.

2. A network according to claim 1, wherein each node in said input layer produces its output value in response to exactly one input value.

3. A network according to claim 1, wherein all of said layers in said plurality of layers are distinct from each other.

4. A network according to claim 1, wherein none of the node output values $y_{k1,j}$ in a layer k1 of said plurality of layers influences any output value $y_{k0,j}$ in a layer k0 of said plurality of layers, where k0<k1.

5. A network according to claim 1, wherein said plurality of nodes includes all of the nodes in said apparatus.

6. A network according to claim 1, wherein said plurality of layers collectively includes all of the nodes in said plurality of nodes.

7. A network according to claim 1, wherein said teaching means comprises back-propagation apparatus.

8. A network according to claim 1, wherein said teaching means comprises means for setting $p_{n,j,1}, \ldots, p_{n,j,P_{n,j}}$ to predetermined values in said network for each node j in layer n.

9. A network according to claim 1, wherein said plurality of layers further includes an output layer different from said input layer and said n'th layer.

10. A network according to claim 9, wherein $f_n$ is a linear function and the node functions for all of said layers except said input layer and said n'th layer are sigmoid functions.

11. A network according to claim 9, wherein layer n-1 is said input layer.

12. A network according to claim 1, wherein for each node j in layer n, $w_{n,j}(i, p_{n,j,1}, \ldots, p_{n,j,P_{n,j}}) \neq 0$ for at least one value of i between $i1_j$ and $i2_j$, inclusive, where $1 \leq i1_j \leq N_{n-1}$, $1 \leq i2_j \leq N_{n-1}$, and $i1_j < i2_j$, $i1_j$ and $i2_j$ being such that at least one value of i exists within $1 \leq i \leq N_{n-1}$, but not within $i1_j \leq i \leq i2_j$;

and wherein $w_{n,j}(p_{n,j,1}, \ldots, p_{n,j,P_{n,j}}) = 0$ for all values of i within $1 \leq i \leq N_{n-1}$ but not within $i1_j \leq i \leq i2_j$.

13. A network according to claim 12, wherein for each node j in layer n, $w_{n,j}(i, p_{n,j,1}, \ldots, p_{n,j,P_{n,j}}) \neq 0$ for all values of i between $i1_j$ and $i2_j$, inclusive.

14. A network according to claim 1, wherein for all nodes j in layer n, $w_{n,j}(i, p_{n,j,1}, \ldots, p_{n,j,P_{n,j}})$ is convex in i.

15. A network according to claim 14, wherein for all nodes j in layer n, $w_{n,j}(i, p_{n,j,1}, \ldots, p_{n,j,P_{n,j}})$ is bell-shaped in i.

16. A network according to claim 1, wherein for all nodes j in layer n, $P_{n,j}=3$ and $$w_{n,j}(i, p_{n,j,1}, p_{n,j,2}, p_{n,j,3}) = \frac{\mu_{n,j}(i)}{U_{n,j}},$$

where $$\mu_{n,j}(i) = \frac{1}{1 + \left[\left(\frac{i - p_{n,j,3}}{p_{n,j,1}}\right)^2\right]^{p_{n,j,2}}}$$

and $$U_{n,j} = \sum_{i=1}^{N_{n-1}} \hat{\mu}_{n,j}(i).$$

17. A network according to claim 16, wherein $f_n$ is linear.

18. A network according to claim 1, wherein for all nodes j in layer n, $P_{n,j}=3$ and $$w_{n,j}(i, p_{n,j,1}, p_{n,j,2}, p_{n,j,3}) = \frac{\mu_{n,j}(i)}{U_{n,j}},$$

where $$\mu_{n,j}(i) = e^{-\left|\frac{i - p_{n,j,1}}{p_{n,j,2}}\right|^{p_{n,j,3}}}$$

and $$U_{n,j} = \sum_{i=1}^{N_{n-1}} \hat{\mu}_{n,j}(i).$$

19. A network according to claim 18, wherein for all nodes j in layer n, $p_{n,j,3}=2$.

20. A neural network having a plurality of nodes each having an output carrying a respective output value y, said nodes being grouped into a plurality of layers including an input layer and an n'th layer different from said input layer, each k'th layer having $N_k$ nodes, the (n-1)'th layer having more than one node, and each j'th node in each k'th layer except said input layer producing its output value $y_{k,j}$ according to the node function $$y_{k,j} = f_k\left(\sum_{i=1}^{N_{k-1}} w_{k,i,j} y_{k-1,i}\right),$$

indexes the nodes of layer k-1 and all the $w_{k,i,j}$ are connection weights, wherein for all nodes j in said n'th layer, $$w_{n,i,j} = w_{n,j}(i, p_{n,j,1}, \ldots, p_{n,j,P_{n,j}}),$$

$P_{n,j}$ being an integer greater than 0 and $w_{n,j}(i, p_{n,j,1}, \ldots, p_{n,j,P_{n,j}})$ being bell-shaped in i;

said network further comprising teaching means for setting values for $p_{n,j,1}, \ldots, p_{n,j,P_{n,j}}$.

21. A computational network having a plurality of nodes each having an output carrying a respective output value y, for use with N input signals each having a respective value $x_i$, N>1, each j'th one of said nodes producing its output value $y_j$ according to the node function $$y_j = f\left(\sum_{i=1}^{N} w_j(i) x_i\right),$$

where $$w_j(i) = \frac{\mu_j(i)}{U_j},$$

-continued $$\mu_j(i) = \frac{1}{1 + \left[\left(\frac{i - c_j}{a_j}\right)^2\right]^{b_j}}$$

and $$U_j = \sum_{i=1}^{N} \hat{\mu}_j(i).$$

22. A network according to claim 21, wherein f is linear.

23. A network according to claim 21, further comprising teaching means for setting values for $a_j$, $b_j$ and $c_j$, for each j'th one of said nodes.

24. A computational network having a plurality of nodes each having an output carrying a respective output value y, for use with N input signal each having a respective value $x_i$, N>1, each j'th one of said nodes producing its output value $y_j$ according to the node function $$y_j = f\left(\sum_{i=1}^{N} w_j(i) x_i\right),$$

where $$w_j(i) = \frac{\mu_j(i)}{U_j},$$

$$\mu_j(i) = e^{-\left|\frac{i - a_j}{b_j}\right|^{r_j}}$$

and $$U_j = \sum_{i=1}^{N} \hat{\mu}_j(i).$$

25. A method for analyzing a plurality of input signals, comprising the steps of:

providing adaptive learning apparatus having a plurality of nodes each having an output carrying a respective output value y, said nodes being grouped into a plurality of layers including an input layer and an n'th layer different from said input layer, each node in said input layer receiving a respective one of said input signals, each k'th layer having $N_k$ nodes, and each j'th node in each k'th layer except said input layer producing its output value $y_{k,j}$ according to the node function $$y_{k,j} = f_k\left(\sum_{i=1}^{N_{k-1}} w_{k,i,j} y_{k-1,i}\right),$$

where i indexes the nodes of layer k-1 and all the $w_{k,i,j}$ are connection weights, wherein for all nodes j in said n'th layer, $$w_{n,i,j} = w_{n,j}(i, p_{n,j,1}, \ldots, p_{n,j,P_{n,j}}),$$

$p_{n,j}$ being an integer greater than zero and less than the number of nodes $N_{n-1}$ in layer n-1, $N_{n-1}>1$; and training said apparatus by setting values for at least one of $p_{n,j,1}, \ldots, p_{n,j,P_{n,j}}$.

26. A method according to claim 25, wherein none of the node output values $y_{k1,j}$ in a layer k1 of said plurality of layers influences any output value $y_{k0,j}$ in a layer k0 of said plurality of layers, where k0<k1.

27. A method according to claim 25, wherein said training step comprises the step of training said apparatus using back-propagation.

28. A method according to claim 25, wherein said training step comprises the step setting $p_{n,j,1}, \ldots,$ and $p_{n,j,P_{n,j}}$ to predetermined values in said apparatus for each node j in layer n.

29. A method according to claim 28, wherein said training step further comprises the step of predetermining said predetermined values for $p_{n,j,1}, \ldots,$ and $p_{n,j,P_{n,j}}$ for each node j in layer n.

30. A method according to claim 25, wherein said plurality of layers further includes an output layer different from said input layer and said n'th layer.

31. A method according to claim 30, wherein $f_n$ is a linear function and the node functions for all of said layers except said input layer and said n'th layer are sigmoid functions.

32. A method according to claim 31, wherein layer n-1 is said input layer.

33. A method according to claim 25, wherein for each node j in layer n, $w_{n,j}(i, p_{n,j,1}, \ldots, p_{n,j,P_{n,j}}) \neq 0$ for all values of i between $i1_j$ and $i2_j$, inclusive, where $1 \leq i1_j \leq N_{n-1}$, $1 \leq i2_j \leq N_{n-1}$, and $i1_j < i2_j$, $i1_j$ and $i2_j$ being such that at least one value of i exists within $1 \leq i \leq N_{n-1}$, but not within $i1_j \leq i \leq i2_j$;

and wherein $w_{n,j}, i, p_{n,j,1}, \ldots, p_{n,j,P_{n,j}}$ for all values of i within $1 \leq i \leq N_{n-1}$ but not within $i1_j \leq i \leq i2_j$.

34. A method according to claim 25, wherein for all nodes j in layer n, $w_{n,j}(i, p_{n,j,1}, \ldots, p_{n,j,P_{n,j}})$ is convex in i.

35. A method according to claim 34, wherein for all nodes j in layer n, $w_{n,j}(i, p_{n,j,1}, \ldots, p_{n,j,P_{n,j}})$ is bell-shaped in i.

36. A method according to claim 25, wherein for all nodes j in layer n, $p_{n,j}=3$ and $$w_{n,j}(i, p_{n,j,1}, p_{n,j,2}, p_{n,j,3}) = \frac{\mu_{n,j}(i)}{U_{n,j}},$$

where $$\mu_{n,j}(i) = \frac{1}{1 + \left[\left(\frac{i - p_{n,j,3}}{p_{n,j,1}}\right)^2\right]^{p_{n,j,2}}}$$

and $$U_{n,j} = \sum_{i=1}^{N_{n-1}} \hat{\mu}_{n,j}(i).$$

37. A method according to claim 25, wherein for all nodes j in layer n, $p_{n,j}=3$ and $$w_{n,j}(i, p_{n,j,1}, p_{n,j,2}, p_{n,j,3}) = \frac{\mu_{n,j}(i)}{U_{n,j}},$$

where $$\mu_{n,j}(i) = e^{-\left|\frac{i - p_{n,j,1}}{p_{n,j,2}}\right|^{p_{n,j,3}}}$$

and $$U_{n,j} = \sum_{i=1}^{N_{n-1}} \hat{\mu}_{n,j}(i).$$

38. A method for analyzing a plurality of input signals, comprising the steps of:

providing adaptive learning apparatus having a plurality of nodes each having an output carrying a respective output value y, said nodes being grouped into a plurality of layers including an input layer and an n'th layer different from said input layer, each node in said input layer receiving a respective one of said input signals, each k'th layer having $N_k$ nodes, the (n-1)'th layer having more than one node, and each j'th node in each k'th layer except said input layer producing its output value $y_{k,j}$ according to the node function $$y_{k,j} = f_k\left(\sum_{i=1}^{N_{k-1}} w_{k,i,j} y_{k-1,i}\right),$$

where i indexes the nodes of layer k-1 and all the $w_{k,i,j}$ are connection weights, wherein for all nodes j in said n'th layer, $$w_{n,j}(i, p_{n,j,1}, \ldots, p_{n,j,P_{n,j}})$$

$P_{n,j}$ being an integer greater than zero and $w_{n,j}(i, p_{n,j,1}, \ldots, p_{n,j,P_{n,j}})$ being bell-shaped in i; and training said apparatus by setting values for $p_{n,j,1}, \ldots,$ and $p_{n,j,P_{n,j}}$.

39. A method for analyzing a plurality of N input signals each having a respective value $x_i$, comprising the steps of:

providing a computational network having a plurality of nodes each having an output carrying a respective output value y, each j'th one of said nodes producing its output value $Y_j$ according to the node function $$y_j = f\left(\sum_{i=1}^{N} w_j(i) x_i\right),$$

where $$w_j(i) = \frac{\mu_j(i)}{U_j},$$

$$\mu_j(i) = \frac{1}{1 + \left[\left(\frac{i - c_j}{a_j}\right)^2\right]^{b_j}}$$

and $$U_j = \sum_{i=1}^{N} \hat{\mu}_j(i);$$

and training said computational network by setting values for $a_j$, $b_j$ and $c_j$, for each j'th one of said nodes.

40. A method according to claim 39, wherein f is linear.

41. A method for analyzing a plurality of input signals each having a respective value $x_i$, comprising the steps of:

providing a computational network having a plurality of nodes each having an output carrying a respective output value y, for use with N input signal each having a respective value $x_i$, each j'th one of said nodes producing its output value $y_j$ according to the node function $$y_j = f\left(\sum_{i=1}^{N} w_j(i) x_i\right),$$

where $$w_j(i) = \frac{\mu_j(i)}{U_j},$$

$$\mu_j(i) = e^{-\left|\frac{i - a_j}{b_j}\right|^{c_j}}$$

and $$U_j = \sum_{i=1}^{N} \hat{\mu}_j(i);$$

and training said computational network by setting values for at least one of $a_j$, $b_j$ and $c_j$, for each j'th one of said nodes.

42. A method for use with a plurality of $N_0$ input signals $x_i$ produced by a system to be analyzed, comprising the steps of:

selecting a parameterized membership function of said input signals;

providing adaptive learning apparatus having a plurality of nodes each having an output carrying a respective output value y, each j'th one of said nodes producing its output value $y_j$ according to the node function $$y_j = f\left(\sum_{i=1}^{N_0} w_{i,j} x_i\right),$$

where i indexes the input signals, wherein for all nodes j, $$w_{i,j} = w_j(i, p_{j,1}, \ldots, p_{j,P})$$

the parameters $p_{j,1}, \ldots,$ and $p_{j,P}$ being trainable parameters, P being an integer greater than zero;

training said apparatus by setting values for said parameters $p_{j,1}, \ldots, p_{j,P}$ for each of said nodes j; and observing said trained values for said parameters $p_{j,1}, \ldots,$ and $p_{j,P}$.

43. A product produced by the method of claim 25.

44. A method according to claim 39, further comprising the steps of:

producing a plasma adjacent to a subject surface, said plasma producing an optical frequency spectrum dependent upon a plurality of process parameters;

forming an amplitude value corresponding to each of a plurality of wavelengths in said optical frequency spectrum;

providing each of said amplitude values as respective ones of said input signals $x_i$; and after said step of training, producing a control signal for one of said process parameters in response to the output value of at least one of said nodes.

* * * * *